(12) United States Patent
Duerbaum et al.

(10) Patent No.: US 7,719,850 B2
(45) Date of Patent: May 18, 2010

(54) ARRANGEMENT WITH AN INTEGRATED CIRCUIT MOUNTED ON A BEARING MEANS AND A POWER SUPPLY MODULE ARRANGEMENT

(75) Inventors: Thomas Duerbaum, Langerwehe (DE); Reinhold Elferich, Aachen (DE)

(73) Assignee: NXP B.V., Eindhoven (NL)

( * ) Notice: Subject to any disclaimer, the term of this patent is extended or adjusted under 35 U.S.C. 154(b) by 953 days.

(21) Appl. No.: 10/240,334

(22) PCT Filed: Feb. 13, 2002

(86) PCT No.: PCT/IB02/00434

§ 371 (c)(1),
(2), (4) Date: Oct. 1, 2002

(87) PCT Pub. No.: WO02/067646

PCT Pub. Date: Aug. 29, 2002

(65) Prior Publication Data

US 2004/0027802 A1 Feb. 12, 2004

(30) Foreign Application Priority Data

Feb. 16, 2001 (DE) .................................. 101 07 839

(51) Int. Cl.
*H05K 7/02* (2006.01)
*H05K 7/06* (2006.01)
*H05K 7/08* (2006.01)
*H05K 7/10* (2006.01)

(52) U.S. Cl. ........................ 361/760; 361/764; 361/766; 361/784; 361/803

(58) Field of Classification Search ................. 361/780, 361/782, 783, 788, 792–794, 820, 761–764, 361/785, 803; 257/691, 698, 700
See application file for complete search history.

(56) References Cited

U.S. PATENT DOCUMENTS

| 4,551,746 | A | * | 11/1985 | Gilbert et al. | ............... 257/691 |
| 5,012,386 | A | * | 4/1991 | McShane et al. | ........... 361/715 |
| 5,289,364 | A |   | 2/1994 | Sakurai | ..................... 363/147 |
| 5,488,256 | A | * | 1/1996 | Tsunoda | ..................... 257/723 |
| 5,648,892 | A | * | 7/1997 | Wieloch et al. | ............. 361/788 |
| 5,734,555 | A | * | 3/1998 | McMahon | .................. 361/704 |
| 5,811,880 | A | * | 9/1998 | Banerjee et al. | ............. 257/724 |

(Continued)

FOREIGN PATENT DOCUMENTS

JP 5-55450 A 3/1993

(Continued)

OTHER PUBLICATIONS

Two definitions of Switching Power Supply on the Internet (through Google)—1 sheet.*

*Primary Examiner*—Tuan T Dinh

(57) ABSTRACT

A power supply module arrangement with an integrated circuit mounted on a bearing unit and a power supply includes an integrated circuit mounted on a bearing unit and a power supply module arrangement that is placed on the combination of bearing unit and integrated circuit. The power supply module arrangement includes a base extending at least partially over the base of the integrated circuit and/or all around the base of the integrated circuit. The power supply module arrangement allows for greater permissible load jumps, greater permissible current change rates and ever tighter tolerances regarding the constancy of the supply voltage.

6 Claims, 3 Drawing Sheets

U.S. PATENT DOCUMENTS

Figure 1:
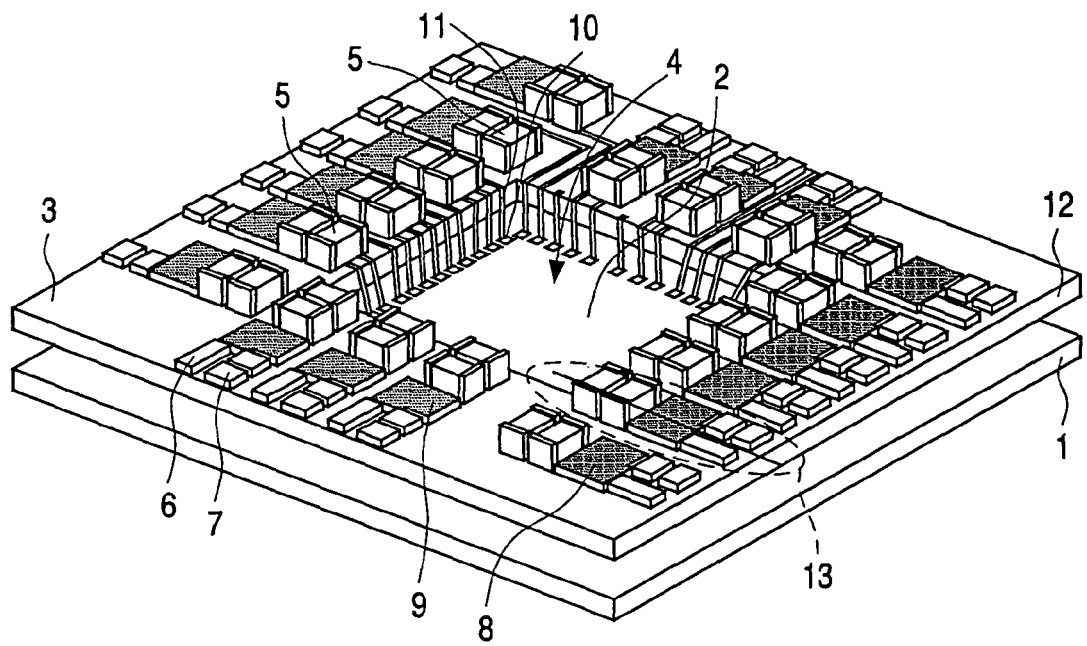

| | | | |
|---|---|---|---|
| 5,831,810 A * | 11/1998 | Bird et al. | 361/301.1 |
| 5,892,275 A * | 4/1999 | McMahon | 257/690 |
| 5,980,267 A | 11/1999 | Ayers et al. | |
| 6,018,465 A | 1/2000 | Borkar et al. | 361/825 |
| 6,222,276 B1 * | 4/2001 | Bertin et al. | 257/778 |
| 6,271,607 B1 * | 8/2001 | Vandenbossche | 310/68 D |
| 6,303,989 B1 * | 10/2001 | Yasuho et al. | 257/706 |
| 6,469,895 B1 * | 10/2002 | Smith et al. | 361/704 |
| 6,515,868 B1 * | 2/2003 | Sasaki et al. | 361/760 |
| 6,549,409 B1 * | 4/2003 | Saxelby et al. | 361/704 |
| 6,556,455 B2 * | 4/2003 | Dibene et al. | 361/785 |

FOREIGN PATENT DOCUMENTS

| | | |
|---|---|---|
| JP | 9-205166 A | 8/1997 |
| WO | 01/06821 A1 | 1/2001 |
| WO | 01/65344 A2 | 9/2001 |
| WO | 01/67512 A2 | 9/2001 |

* cited by examiner

ARRANGEMENT WITH AN INTEGRATED CIRCUIT MOUNTED ON A BEARING MEANS AND A POWER SUPPLY MODULE ARRANGEMENT

The invention relates to an arrangement with an integrated circuit mounted on a bearing means and a power supply module arrangement.

In the power supply of integrated circuits, which have to be supplied with low voltages and high currents at high clock rates, parasitic feeder effects cause problems, in particular due to no longer negligibly small line inductances. In known arrangements in personal computers power supply modules designated as Voltage Regulator Modules (VRMs) are provided on motherboards to supply power to processors. Such arrangements can no longer guarantee a power supply satisfying all the technical requirements with regard to ever greater permissible load jumps, greater permissible current change rates and ever tighter tolerances regarding the constancy of the supply voltage in question.

It is an object of the invention to provide arrangements that meet these ever more demanding requirements.

The object is achieved by an arrangement with an integrated circuit mounted on a bearing means and a power supply module arrangement placed on the combination of bearing means and integrated circuit, whose base extends at least partially over the base of the integrated circuit and/or all round the base of the integrated circuit.

The power supply module arrangement and the integrated circuit are preferably offset perpendicular to the base of the integrated circuit. With such an arrangement the line lengths of power feeds between output filters of the power supply module arrangement and the corresponding power terminals of the integrated circuit can be minimized. Furthermore, a great number of power supply modules, each of which supplies a presettable supply voltage, can be combined into a compact power supply module arrangement, which can be placed on the combination of bearing means and integrated circuit, so that in cases of prefabricated power supply module arrangements further mounting is possible with little effort. The bases of the power supply module arrangement can overlap, possibly in part. However, the base of the power supply module arrangement can also extend all around the base of the integrated circuit, i.e. in so far as without overlapping of the bases and over all (usually four) sides of the power supply module arrangement. The two approaches to the spatial arrangement of the base of the power supply module arrangement relative to the base of the integrated circuit can also be combined.

In an exemplary embodiment, the power supply module arrangement has several power supply modules with a corresponding number of output terminals, which in their turn are connected to a corresponding number of external power supply terminals (not necessarily the same as the number of output terminals mentioned) of the integrated circuit, it being possible to make these connections by means of electric lines of minimized length.

One exemplary aspect of the invention can provide an advantage that with a recess adapted to the base of the integrated circuit, short electrical connections that connect the output terminals of the power supply modules to the corresponding external power supply terminals of the integrated circuit can be fed through the recess. Feeding electrical connections through the material of the printed circuit board supporting the power supply modules is consequently unnecessary. A further advantage is that a cooling device for cooling the integrated circuit can reach through the recess.

In another exemplary embodiment, the arrangement of a great number of power supply modules in the area surrounding the recess, the area surrounding the recess in this case being taken to mean all the edges of the recess, which in the case of a square recess for example is all four edges and a narrow area along these edges.

In still another exemplary embodiment, the electrical contacts between the circuits of the power supply module arrangement and the external power supply terminals of the integrated circuit are made in the area next to the integrated circuit. The power supply output filter capacitors are used as connecting elements, i.e. they have a direct electrical connection to the power supply contact points which are placed on the bearing means next to the integrated circuit. The power supply contact points are connected to the external power supply terminals of the integrated circuit by way of low-impedance and low-inductance connections, which lead directly to the external power supply terminals of the integrated circuit. In particular so-called ceramic multilayer capacitors, which here can act as mechanical means of support, are used as power supply output filter capacitors.

On yet another exemplary embodiment of the invention, there is a use of the whole surface area of the integrated circuit for external power supply terminals of the integrated circuit, the external power supply terminals in particular being uniformly distributed over the corresponding surface side of the integrated circuit. In this way a great number of electrical connections can be made between the power supply module arrangement and the integrated circuit with minimal parasitic effects (because of minimized line lengths). With this approach a corresponding embodiment of the integrated circuit is required in which the external power supply terminals of the integrated circuit are located on the side of the integrated circuit turned away from the board of the integrated circuit.

In still another exemplary embodiments, the power supply includes output filter capacitors, which are located between a printed circuit board of the power supply module arrangement and the integrated circuit, with the power supply output filter capacitors being directly connected to the external power supply terminals of the integrated circuit. The distance between the power supply output filter capacitors and the external power supply terminals of the integrated circuit is reduced to a minimum (near zero).

In even another exemplary embodiment an additional advantage includes a cooling of the integrated circuit.

Various exemplary embodiments of the power supply module include several printed circuit board areas. By placing printed circuit board areas of the power supply module at an angle, the power supply module can, on the one hand, be made more compact. On the other, the same cooling device can be used to cool electronic components located on these angled printed circuit board areas as is used to cool the integrated circuit.

The problem is also solved by an arrangement with an integrated circuit mounted on a bearing means and several power supply modules with separate power supply output terminals located all around the integrated circuit.

With this approach the output terminals of the power supply module arrangement can be located in the immediate vicinity of the corresponding external terminals of the integrated circuit, even with a great number of external power supply terminals of the integrated circuit, to which a great number of supply voltages are to be fed, so that the line lengths of the respective electrical connections can be reduced to a minimum.

In another exemplary embodiment of the invention, a power supply module arrangement is located next to the integrated circuit. In such arrangements the length of electrical connections between the output filter capacitors and the associated external power supply terminals of the integrated circuit can be minimized by relocation of output filter capacitors. In a preferred form of the invention a control ensures that the supply voltage(s) fed to the integrated circuit lie within the required tolerance range. The control is affected by the provision of additional measuring lines, along which only negligibly small currents flow, between the power supply module arrangement and the integrated circuit.

In addition, parts of the above-described arrangements according to the invention can be produced separately.

These and other aspects of the invention are apparent from and will be elucidated, by way of non-limiting example, with reference to the embodiment(s) described hereinafter.

Figure 2:
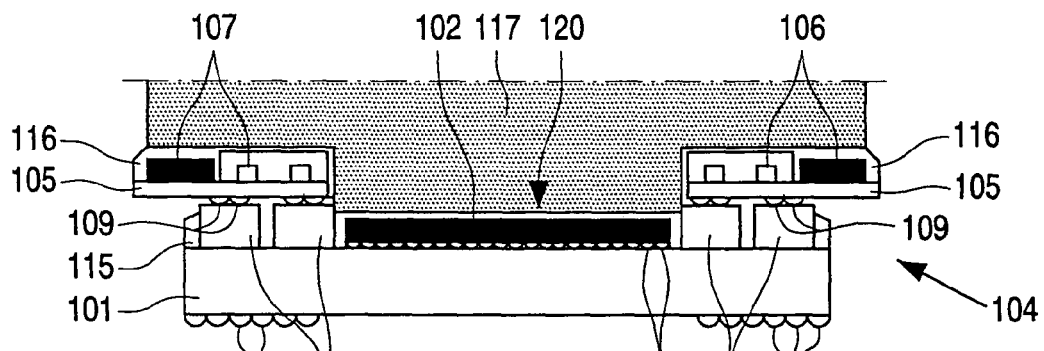
Figure 3:
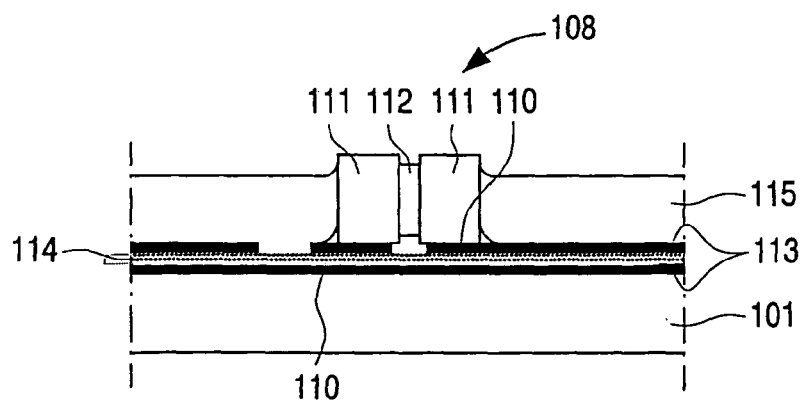
Figure 4:
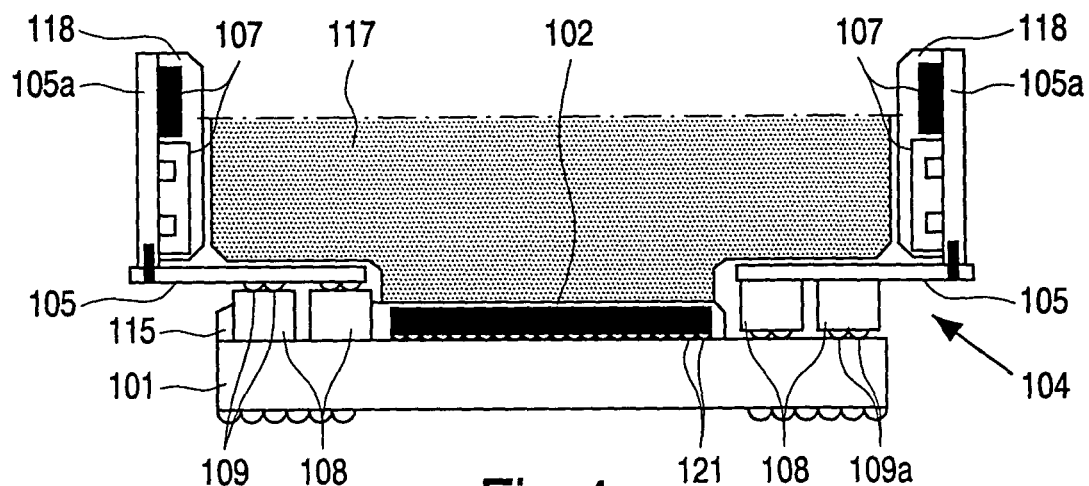
Figure 5:
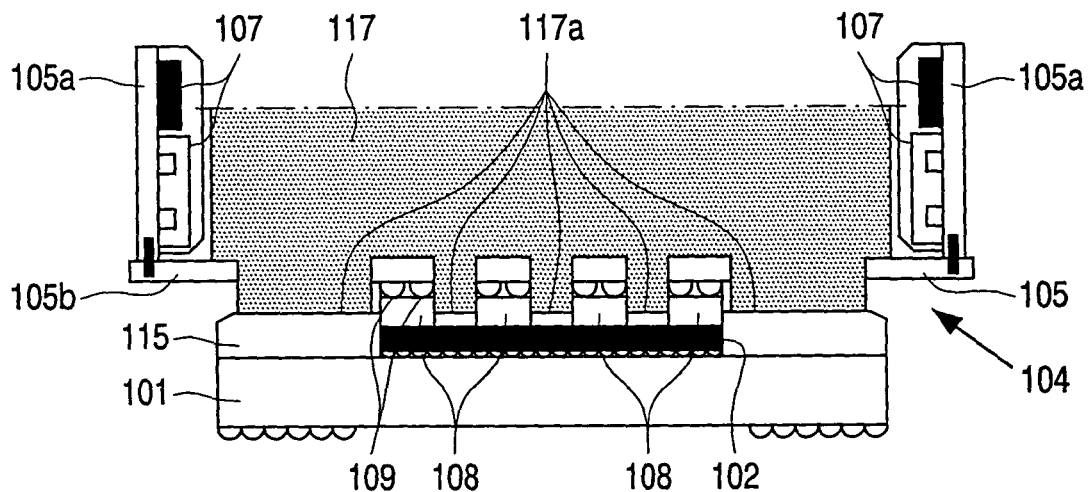
Figure 6:
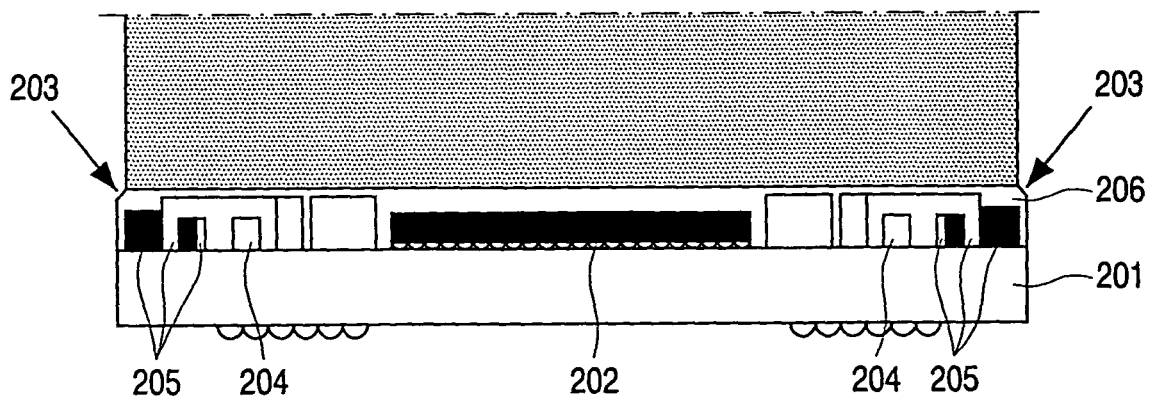
Figure 7:
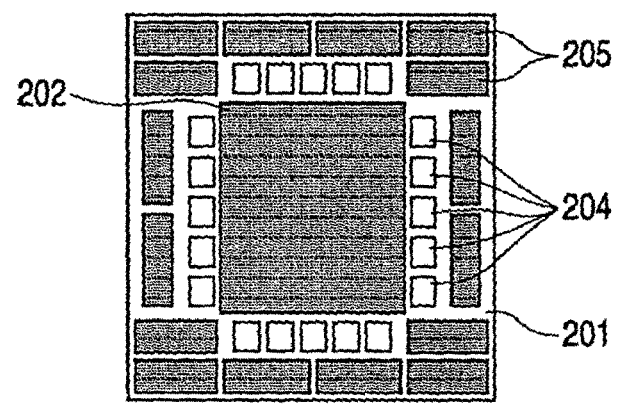
Figure 8:
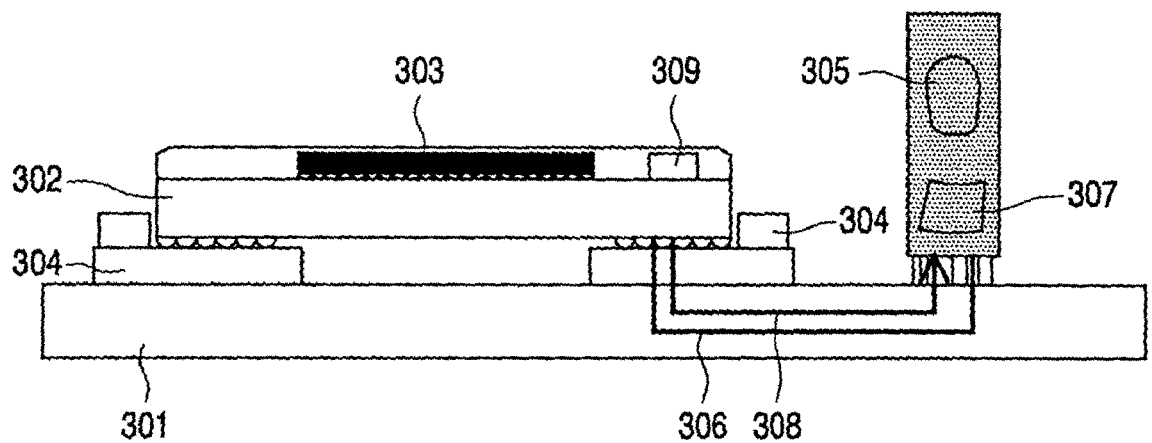

In the drawings:

FIG. 1 shows an arrangement with an integrated circuit mounted on a bearing means and fitted power supply module arrangement, FIG. 2 shows an embodiment in which power supply output filter capacitors are placed on the bearing means next to the integrated circuit, FIG. 3 shows a detail of the arrangement shown in FIG. 2, FIG. 4 shows a modification of the embodiment shown in FIG. 2 with angled parts of the power supply module arrangement, FIG. 5 shows a further variation of the embodiment shown in FIG. 4, in which external power supply terminals are provided on the top side of the integrated circuit, FIG. 6 shows an arrangement according to the invention with the power supply modules placed all around the integrated circuit, FIG. 7 shows a top view of the arrangement shown in FIG. 6 with no cooling device and no encapsulation and FIG. 8 shows an embodiment of the invention in which a power supply module is placed on a motherboard of a personal computer next to a combination of bearing means and integrated circuit.

FIG. 1 shows an arrangement with an integrated circuit 2 mounted on a bearing means 1. Placed on the combination of bearing means 1 and integrated circuit 2 is a power supply module arrangement 3, which has a great number of power supply modules located all around a recess 4 in the power supply module arrangement 3, one of the power supply modules being marked with the reference number 13 by way of example. The area of the recess 4 essentially extends over the base of the integrated circuit 2, so that a cooling device (not shown: e.g. with heat sink, fan, heat spread, heat pipe, etc.) can pass through the recess 4 and rest on the top side of the integrated circuit, so that the thermal energy generated by the integrated circuit 2 in operation can be effectively dissipated to the environment by way of the cooling device. The power supply modules 13 contain power supply output filter capacitors 5, driver circuits 6, switching devices 7 and magnetic components (coils or transformers). For reasons of clarity each component type used for the power supply module arrangement 3 has only been given a reference number once. The design of the power supply modules is only shown by way of example. The precise design of the power supply modules depends on the converter type (in particular Buck converter) used in each case. Output filter capacitors however exist with all converter types.

In the embodiment shown in FIG. 1 electrical connections between external power supply terminals 10 and output terminals of the power supply modules 13, which correspond to terminals of the output filter capacitors 5 located on the edges of the recess 4, are made by way of electrical connections 11 formed here as wire junctions, which are passed through the recess 4. For the sake of clarity again only one external power supply terminal and one wire junction bond are given a reference number. Used for the power supply module arrangement 3 in the case in question is a single printed circuit board 12, on which the circuits and components of the power supply module arrangement are placed and which acts as a substrate for the power supply module arrangement. The output filter capacitors 5 are located on the printed circuit board 12 in the edge area immediately adjoining the recess 4, the output filter capacitors 5 being uniformly distributed in this case over all four edges of the recess 4. In theory the distribution of the output filter capacitors or of the power supply modules can differ, i.e. distribution over the edges of the recess need not be uniform; nor is there any need for the output filter capacitors or the power supply modules to be distributed over all the edges of the recess 4. In the embodiment in question the output terminals of the various power supply modules lie opposite associated external power supply terminals of the integrated circuit 2. The length of the wire junctions 11 is consequently reduced to a minimum and depends on the distance of printed circuit board 12 of the power supply module arrangement 3 from the bearing means 1 and from the integrated circuit 2 respectively, and on the thickness of the printed circuit board 12. With the arrangement shown in FIG. 1 it is possible to feed the integrated circuit 2 with a great number of supply voltages having equal and/or different voltage values, the lengths of the electrical connections 11 between the external power supply terminals 10 of the integrated circuit 2 and the power supply outputs of the power supply module arrangement 3 being reduced to a minimum. The arrangement is suitable for the power supply of future processor generations, which will require high supply currents, large load jumps, high current change rates of supply currents and otherwise intensified requirements in respect of permissible fluctuations of the supply voltages.

The arrangement shown in FIG. 2 shows an integrated circuit 102 placed on a bearing means 101. On its underside bearing means 101 has contacts 103, by means of which circuits of a motherboard of, for example, a personal computer, onto which the arrangement shown in FIG. 2 can be placed can be contacted. Placed on the combination of integrated circuit 102 and bearing means 101 is a power supply module arrangement 104, which has a printed circuit board 105 acting as a substrate, located on which are power supply circuits and components of different power supply modules, which generate different supply voltages. Shown by way of example are components 106 belonging to a first power supply module and components 107 belonging to a second power supply module, which in each case belong to one power supply module (arrangement of power supply modules 13 as in FIG. 1). The printed circuit board 105, like the printed circuit board 12 in FIG. 1, contains a recess 120, which extends above the integrated circuit 102 approximately across the surface of the integrated circuit 102 and all around which, as in FIG. 1, the power supply modules used are located. Located next to the integrated circuit 102 on the bearing means 101 are power supply output filter capacitors 108. They are connected by way of contacts 109 located on the underside of the printed circuit board 105 to the associated circuits of the power supply module arrangement 104, in this case by means of detachable touch contacts. On the other side the output filter capacitors 108 are connected to power supply contact points 110 located next to the integrated circuit 102 on the bearing means 101, in this case by means of permanent solder joints, by which an electrical connection is made with the external power supply terminals 121 (given reference numbers by way of example) of the integrated circuit 102, which FIG. 3 elucidates in further detail.

As can be seen from FIG. 3, in the example of the embodiment in question ceramic multilayer capacitors are used as output filter capacitors 108, which have two opposing metallic contact layers 111; the capacitor dielectric is marked with reference number 112. A supply potential is in each case transmitted by way of one of the two contact layers 111 and the associated reference potential by way of the other contact layer 111 of a capacitor 108. The supply potential and the reference potential are fed to the associated external power supply terminals 121 of the integrated circuit 102 with the aid of two opposing conductor layers 113, each of which is connected to a contact point 110. The conductor layers 113 are electrically insulated from one another, in particular by dielectric—for example ceramic—material 114.

In the embodiment shown in FIGS. 2 and 3 an encapsulation 115 is also provided, which covers the integrated circuit 102 and the output filter capacitors 108. An encapsulation marked with the reference number 116 is also provided as an advantageous embodiment for the components (106, 107) of the power supply module arrangement 104. Also provided is a cooling device 117, which is used for cooling the heat-generating components of the power supply module arrangement 104 and for cooling the integrated circuit 102. A projecting part of the cooling device 117 passes through the recess 120 and lies 110 flat on the integrated circuit 102 and on the part of the encapsulation 115 located above the integrated circuit 102 respectively. The cooling device 117 can be arranged in the usual way; to improve the cooling a fan can also be used in the usual way.

FIG. 4 shows a variation of the embodiment shown in FIG. 2. In this arrangement the printed circuit board 105 is supplemented by printed circuit board parts 105a, which stand perpendicularly on the printed circuit board 105 running parallel to the bearing means 101 and integrated circuit 102 respectively. At least some of the components 107 to be cooled are located on the printed circuit board parts 105a. In the example of the embodiment in question a further encapsulation 118 is provided for the components and circuits, respectively, located on the printed circuit board parts 105a. The angled printed circuit board areas 105a can also in theory stand at other angles to the printed circuit board area 105. They are, however, advantageously arranged so that they are directly adjacent to the cooling device 117 and an optimum heat transmission into the cooling device 117 is secured. A compact structural shape of the whole arrangement is promoted by angling printed circuit board areas. FIG. 4 also shows that the encapsulation 115 does not necessarily have to extend over the power supply output filter capacitors 108, but can also cover just the integrated circuit 102, as is shown in FIG. 4 where the power supply output filter capacitors 108 on the right-hand side are not covered by the encapsulation 115 shown. Power supply output filter capacitors 108 not covered by the encapsulation can be soldered onto the underside of the printed circuit board 105 in the fabrication of the power supply module arrangement 104; the bonding of contact points on the top side of the bearing means 101 connected to external power supply terminals 121 and lying next to the integrated circuit 102 is effected in this case by contacts marked 109a (solder or contact joints). Power supply output filter capacitors 108 covered by the encapsulation 115 are to be integrated into the fabrication of the combination of bearing means 101 and integrated circuit 102.

In the embodiment shown in FIG. 5 the bonding of the external power supply terminals of the integrated circuit 102 with the corresponding power supply output terminals of the power supply module arrangement 104 is further optimized compared with the embodiment shown in FIG. 4. In this case an integrated circuit 102 is used whose external power supply terminals are carried on its top side, the other terminals of the integrated circuit 102 being on the underside of the integrated circuit and consequently on the side turned towards the bearing means 101. To make the bondings with the power supply module 104, the corresponding power supply output filter capacitors 108, which in their turn are adjacent on the other side to corresponding contact points 109 on the underside of the power supply module arrangement 104 in a central, continuous area of the printed circuit board 105, are placed and fixed on the external power supply terminals of the integrated circuit 102. Furthermore, this example of embodiment provides for an encapsulation 115, which covers the entire integrated circuit 102 and here extends over the entire bearing means 101, only the power supply output filter capacitors 108 partially protruding through the outside of the encapsulation 115. In this approach the cooling device 117 used has several projecting parts 117a, which pass through corresponding recesses in the printed circuit board 105. The projecting parts 117a fill spaces between the power supply output filter capacitors 108 and rest either—as shown here—on the encapsulation 115 or directly on the integrated circuit 102. The embodiment shown in FIG. 5 can be regarded as especially preferred, as in this case unwanted parasitic effects are reduced in a particularly effective way.

FIGS. 6 and 7 show a further embodiment of the invention. In this arrangement several power supply modules are located all round an integrated circuit 202 on a bearing means 201, both the integrated circuit 202 and the power supply modules being placed directly on the bearing means 201. Here the power supply modules are marked with reference number 203 and have power supply output filter capacitors 204 and other power supply components/circuits 205, which are shown only in principle here. FIG. 6 also shows an optional encapsulation 206, which extends over the integrated circuit 202 and the power supply circuits/components. FIG. 7 shows how the power supply output filter capacitors 204 are located all around the integrated circuit 202, and in its immediate vicinity, in order to keep the connecting lines between the power supply output filter capacitors 204 and the corresponding external power supply terminals of the integrated circuit 202 as short as possible; the connecting lines are preferably constructed as shown in FIG. 3 and the associated description. Here the power supply output filter capacitors are distributed evenly over all four sides of the integrated circuit 202; in theory, however, a different distribution of the power supply output filter capacitors 204 around the integrated circuit 202 is also possible. There is no need, for example, for the power supply output filter capacitors 204 to be located on all four sides of the integrated circuit 202. Likewise in this embodiment the integrated circuit 202 can be fed with a great number of equal or different supply voltages by power supply modules distributed all around the integrated circuit, with power supply output filter capacitors 204 closely adjacent to the integrated circuit 202, parasitic effects due in particular to non-negligible line inductances being effectively reduced here too because of connecting lines of minimized length between the power supply output filter capacitors 204 and the external power supply terminals of the integrated circuit 202.

FIG. 8 shows an arrangement with a motherboard 301 (for example, the motherboard of a personal computer), located on which is an integrated circuit 303 placed on a bearing means 302, the combination of bearing means 302 and integrated circuit 303 in its turn being placed on a base 304 to make a connection with the circuit structures of the motherboard 301. In addition to the bearing means 302, here the motherboard 301 also indirectly performs the function of a bearing means for the integrated circuit 303 (in theory versions are also possible in which the integrated circuit is placed directly on the motherboard 301; the same goes for the versions shown in FIGS. 1 to 7, in which the motherboard of a personal computer can also function as a bearing means). Also located on the motherboard 301 in addition to the integrated circuit 303, i.e. here in addition to the bearing means 302 and the base 304, is a power supply module 305, which feeds a supply voltage by way of connecting lines running in the motherboard 306 to corresponding contact points on the underside of the bearing means 302 and consequently to the integrated circuit 303. To counteract parasitic effects due to the non-negligible line lengths of the feed line 306 and to minimize fluctuations of a supply voltage fed to the integrated circuit 303, the power supply module contains a control circuit 307, which evaluates voltages measured by means of the measuring lines 308 and adjusts the voltage applied to the connecting line 306, so that the supply voltage derived from the respective voltage applied to the line 306 and fed to the integrated circuit lies within the required tolerance range. In the present arrangement a power supply output filter capacitor 309 is relocated from the power supply module 305 and placed on the bearing means 302 in the immediate vicinity of the integrated circuit 303 (although it could also be placed on the side of the bearing means 302 opposite the integrated circuit in the immediate vicinity of the integrated circuit 303); the voltage applied to the power supply output filter capacitor 309 is tapped and fed to the control circuit 307 by the measuring line 308. The power supply output filter capacitor 309 is connected by connections not shown, which run through the bearing means 302, to contact points located on the underside of the bearing means 302, which in their turn are connected to the lines 306 and 308. The approach described is of course applicable to the use of power supply modules that generate several supply voltages and/or the use of several power supply modules distributed around the integrated circuit. Again by way of example just a single power supply output filter capacitor 309 is shown. Even with a single power supply module several power supply output filter capacitors connected in parallel are usually required to achieve a sufficiently high capacitance.

The representations in FIGS. 1 to 8 are merely schematic representations for the representation of the principles according to the invention. For the sake of clarity of the representation details that are not essential for the invention and that are self-evident to the specialist, and that the specialist will add on the basis of his expertise, have not been shown and elucidated.

The invention claimed is:

1. An arrangement with an integrated circuit mounted on a bearing means and a power supply module arrangement, placed on the combination of bearing means and integrated circuit and whose base at least partially extends over the base of the integrated circuit and/or all around the base of the integrated circuit,
   wherein the bearing means has power supply contact points in the area next to the integrated circuit, which are connected to external power supply terminals of the integrated circuit and in that power supply output filter capacitors of the power supply module arrangement are arranged to make electrical connections with the power supply contact points between a substrate of the power supply module arrangement and the power supply contact points, the power supply output filter capacitors being situated between the bearing means and the substrate,
   wherein the connection between the external power supply terminals of the integrated circuit and the power supply contact points of the bearing means is made by electrically highly conductive layers of the bearing means which are separated from one another by insulating material.

2. An arrangement as claimed in claim 1, wherein the insulating material is dielectric material, in particular ceramic material.

3. An arrangement as claimed in claim 1, wherein the integrated circuit has external power supply terminals on its surface side turned away from the bearing means and in the external power supply terminals lie opposite corresponding power supply output terminals of the power supply module arrangement.

4. An arrangement as claimed in claim 1, wherein the power supply module arrangement has recesses in the area above the integrated circuit through which to pass projecting parts of a cooling device.

5. An arrangement as claimed in claim 1, wherein the power supply module arrangement has at least one component-mounting substrate area, which is angled to that surface side of the bearing means on which the integrated circuit is placed.

6. An arrangement as claimed in claim 5, wherein the angled substrate area, in particular angled approximately at right angles, supports power supply components and rests against a cooling device used for cooling the integrated circuit.

* * * * *